United States Patent
Kim et al.

(10) Patent No.: US 11,862,603 B2
(45) Date of Patent: Jan. 2, 2024

(54) SEMICONDUCTOR PACKAGES WITH CHIPS PARTIALLY EMBEDDED IN ADHESIVE

(71) Applicant: Samsung Electronics Co., Ltd., Suwon-si (KR)

(72) Inventors: Taewook Kim, Asan-si (KR); Jongho Lee, Hwaseong-si (KR); Jeongjoon Oh, Cheonan-si (KR); Hyeon Hwang, Asan-si (KR)

(73) Assignee: Samsung Electronics Co., Ltd.

( * ) Notice: Subject to any disclaimer, the term of this patent is extended or adjusted under 35 U.S.C. 154(b) by 9 days.

(21) Appl. No.: 17/001,978

(22) Filed: Aug. 25, 2020

(65) Prior Publication Data

US 2021/0159213 A1 May 27, 2021

(30) Foreign Application Priority Data

Nov. 27, 2019 (KR) ........................ 10-2019-0154074

(51) Int. Cl.
| | |
|---|---|
| *H01L 21/768* | (2006.01) |
| *H01L 23/522* | (2006.01) |
| *H01L 23/00* | (2006.01) |
| *H01L 23/31* | (2006.01) |
| *H01L 23/495* | (2006.01) |
| *H01L 23/528* | (2006.01) |

(Continued)

(52) U.S. Cl.
CPC .. *H01L 25/0652* (2013.01); *H01L 2225/0651* (2013.01); *H01L 2225/06513* (2013.01); *H01L 2225/06541* (2013.01); *H01L 2225/06575* (2013.01); *H01L 2225/06586* (2013.01); *H01L 2225/06589* (2013.01)

(58) Field of Classification Search
CPC ......... H01L 25/0652; H01L 2225/0651; H01L 2225/06513; H01L 2225/06541; H01L 2225/06575; H01L 2225/06586; H01L 2225/06589; H01L 2924/19103; H01L 2224/12105; H01L 2224/92144; H01L 2225/1058; H01L 2225/06562
See application file for complete search history.

(56) References Cited

U.S. PATENT DOCUMENTS

| | | | |
|---|---|---|---|
| 6,496,373 B1 * | 12/2002 | Chung | .................. H01L 23/433 257/E23.09 |
| 6,963,132 B2 | 11/2005 | Hakey et al. | |
| 7,087,455 B2 | 8/2006 | Fukuda et al. | |

(Continued)

FOREIGN PATENT DOCUMENTS

| | | |
|---|---|---|
| KR | 100744147 | 8/2007 |
| KR | 20080094203 A | 10/2008 |

(Continued)

*Primary Examiner* — Marcos D. Pizarro
*Assistant Examiner* — Tenley H Schofield
(74) *Attorney, Agent, or Firm* — Myers Bigel, P.A.

(57) ABSTRACT

A semiconductor package includes a package substrate; a plurality of lower chip structures on the package substrate; an upper chip structure on the plurality of lower chip structures and covering portions of upper surfaces of the plurality of lower chip structures; a non-conductive adhesive layer on a lower surface of the upper chip structure and receiving upper portions of the plurality of lower chip structures; and a molded member on the plurality of lower chip structures and the upper chip structure.

18 Claims, 9 Drawing Sheets

(51) Int. Cl.
  *H01L 23/532*  (2006.01)
  *H01L 25/065*  (2023.01)

(56) References Cited

U.S. PATENT DOCUMENTS

| | | | |
|---|---|---|---|
| 7,633,144 B1* | 12/2009 | Kim | H01L 21/561 |
| | | | 257/678 |
| 7,859,119 B1 | 12/2010 | St Amand et al. | |
| 7,948,077 B2 | 5/2011 | Andry et al. | |
| 8,618,653 B2 | 12/2013 | Ko et al. | |
| 8,691,628 B2 | 4/2014 | Tane et al. | |
| 8,915,418 B2 | 12/2014 | Shiratori et al. | |
| 9,812,410 B2 | 11/2017 | Ho et al. | |
| 10,008,642 B2 | 6/2018 | Seo et al. | |
| 2001/0004546 A1* | 6/2001 | Tobita | H01L 23/433 |
| | | | 257/E23.09 |
| 2002/0179289 A1* | 12/2002 | Yamashita | H01L 23/3737 |
| | | | 257/E23.087 |
| 2005/0205981 A1 | 9/2005 | Yoshimura et al. | |
| 2005/0253229 A1* | 11/2005 | Fukui | H01L 25/50 |
| | | | 257/E21.705 |
| 2006/0139893 A1* | 6/2006 | Yoshimura | H01L 24/49 |
| | | | 361/735 |
| 2007/0126097 A1* | 6/2007 | Lin | H01L 24/29 |
| | | | 257/E25.013 |
| 2008/0185709 A1* | 8/2008 | Ishihara | H01L 24/32 |
| | | | 257/698 |
| 2008/0258288 A1 | 10/2008 | Park et al. | |
| 2010/0155925 A1* | 6/2010 | Kunimoto | H01L 25/16 |
| | | | 257/690 |
| 2012/0086125 A1* | 4/2012 | Kang | H01L 25/0657 |
| | | | 257/738 |
| 2012/0236582 A1* | 9/2012 | Waragaya | H01L 33/507 |
| | | | 257/E33.072 |
| 2016/0079184 A1* | 3/2016 | Tsukiyama | H01L 24/13 |
| | | | 257/737 |
| 2018/0122771 A1 | 5/2018 | Park | |
| 2018/0342481 A1 | 11/2018 | Lee et al. | |
| 2019/0051634 A1* | 2/2019 | Park | H01L 25/0657 |
| 2019/0295952 A1* | 9/2019 | Sikka | H01L 23/055 |
| 2021/0082895 A1* | 3/2021 | Miura | H01L 25/0652 |

FOREIGN PATENT DOCUMENTS

| | | |
|---|---|---|
| KR | 20180046990 A | 5/2018 |
| KR | 20180130043 A | 12/2018 |

* cited by examiner

II-II'

SEMICONDUCTOR PACKAGES WITH CHIPS PARTIALLY EMBEDDED IN ADHESIVE

CROSS-REFERENCE TO RELATED APPLICATION(S)

This application claims benefit of priority to Korean Patent Application No. 10-2019-0154074 filed on Nov. 27, 2019, in the Korean Intellectual Property Office, the disclosure of which is incorporated herein by reference in its entirety.

BACKGROUND

The present inventive concepts relate to semiconductor packages, and to semiconductor packages having a chip stack structure.

Recently, demand for portable devices has rapidly increased in the electronic products market, and as a result, miniaturization and lightening of electronic components mounted in the electronic products are continuously pursued. In order to reduce the size and weight of electronic components, semiconductor packages mounted thereon may need to process high-capacity data while their volumes become smaller. There is a need for high integration and single packaging of semiconductor chips mounted in such semiconductor packages. Accordingly, a semiconductor package having a stack structure may be utilized to allow semiconductor chips to be efficiently arranged within a limited semiconductor package structure.

SUMMARY

Example embodiments of the inventive concepts provide semiconductor packages that may maintain reliability while efficiently arranging semiconductor chips in a limited space of the package.

According to an example embodiment, a semiconductor package includes a package substrate; a plurality of lower chip structures on the package substrate; an upper chip structure on the plurality of lower chip structures and covering portions of upper surfaces of the plurality of lower chip structures; a non-conductive adhesive layer on a lower surface of the upper chip structure and receiving upper portions of the plurality of lower chip structures; and a molded member on the plurality of lower chip structures and the upper chip structure.

According to an example embodiment, a semiconductor package includes a package substrate; first and second chip structures on the package substrate and having different heights; a semiconductor chip on the first and second chip structures and covering portions of upper surfaces of the first and second chip structures; a non-conductive adhesive layer on a lower surface of the semiconductor chip and having first and second receiving portions receiving upper portions of the first and second chip structures, wherein a thickness of a portion of the non-conductive adhesive layer that is located between the first and second chip structures is greater than respective thicknesses of the first and second receiving portions of the non-conductive adhesive layer; and a molded member on the package substrate and on the first and second chip structures and the semiconductor chip.

According to an example embodiment, a semiconductor package includes a package substrate; first and second chip structures on the package substrate and having different heights; a semiconductor chip on the first and second chip structures and covering portions of upper surfaces of the first and second chip structures; a non-conductive adhesive layer having a first adhesive material layer on a lower surface of the semiconductor chip, and a second adhesive material layer on the first adhesive material layer and receiving upper portions of the first and second chip structures; and a molded member on the package substrate and on the first and second chip structures and the semiconductor chip.

According to an example embodiment, a semiconductor package includes a package substrate; a first chip structure on the package substrate and comprising an upper surface at a first distance from the package substrate; a second chip structure on the package substrate and comprising an upper surface at a second distance from the package substrate, wherein the second distance is different than the first distance; a semiconductor chip on the upper surfaces of the first and second chip structures; and a non-conductive adhesive layer on a lower surface of the semiconductor chip, wherein the non-conductive adhesive layer comprises a first portion that is between the first chip structure and the semiconductor chip, a second portion that is between the second chip structure and the semiconductor chip, and a third portion that is between the first chip structure and the second chip structure, wherein a thickness of the third portion is greater than a thickness of the first portion and/or the second portion.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, embodiments of the present inventive concepts will be described in detail with reference to the accompanying drawings.

Figure 1:
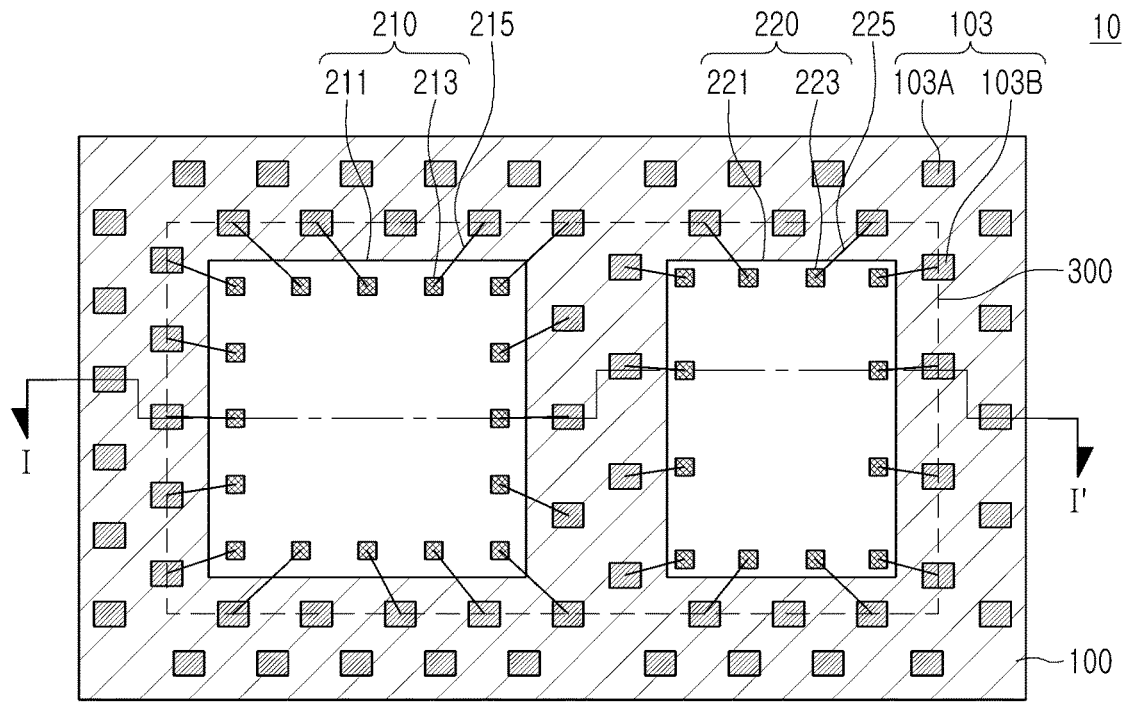
FIG. 1 is a plan view of a semiconductor package according to an embodiment of the present inventive concepts.
Figure 2:
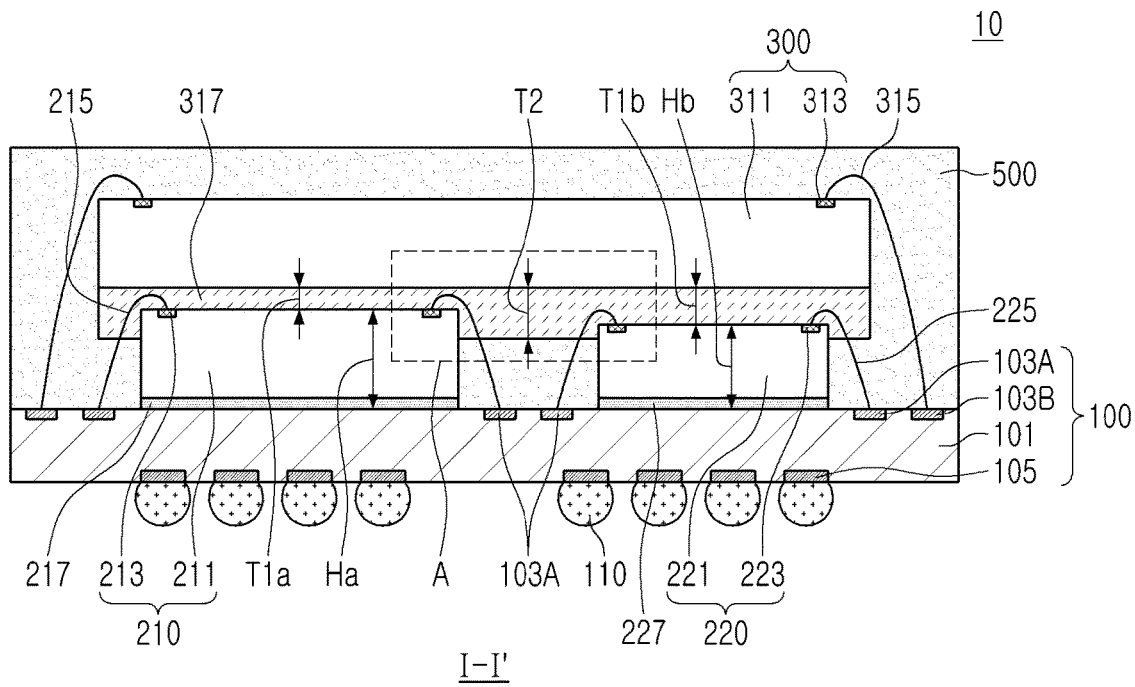
FIG. 2 is a cross-sectional view taken along line I-I' of the semiconductor package of FIG. 1.

FIG. 1 is a plan view of a semiconductor package 10 according to an embodiment of the present inventive concepts, and FIG. 2 is a cross-sectional view taken along line I-I' of the semiconductor package 10 of FIG. 1.

Referring to FIGS. 1 and 2, a semiconductor package 10 according to this embodiment may include a package substrate 100, first and second lower semiconductor chips 210 and 220 arranged on the package substrate 100, and an upper semiconductor chip 300 disposed on the first and second lower semiconductor chips 210 and 220. FIG. 1 illustrates an arrangement of the first and second lower semiconductor chips 210 and 220, and the upper semiconductor chip 300 is schematically illustrated by a dotted line. It will be understood that, although the terms first, second, third, etc. may be used herein to describe various elements, the elements should not be limited by these terms; rather, these terms are only used to distinguish one element from another element. Thus, a first element discussed could be termed a second element without departing from the scope of the present inventive concepts.

The package substrate 100 may include a body portion 101, an upper substrate pad 103 disposed on an upper surface of the body portion 101, and a lower substrate pad 105 disposed on a lower surface of the body portion 101. In addition, the package substrate 100 may have a wiring pattern (not illustrated) and/or a connection via (not illustrated) electrically connecting the upper substrate pad 103 and the lower substrate pad 105.

For example, the package substrate 100 may be a printed circuit board. The package substrate 100 is not limited to a printed circuit board, but may be various types of wiring boards and/or other structures providing electrical connectivity.

The package substrate 100 may be made of at least one material selected from a phenol resin, an epoxy resin, and a polyimide. For example, the package substrate 100 may include FR4, tetrafunctional epoxy, polyphenylene ether, epoxy/polyphenylene oxide, bismaleimidetriazine (BT), Thermount, cyanate ester, polyimide, and/or liquid crystal polymer. In addition, the upper substrate pad 103, the lower substrate pad 105, the wiring pattern, and the connection via may include, for example, copper (Cu), nickel (Ni), aluminum (Al), and/or beryllium copper.

An external connection terminal 110 may be formed on the lower substrate pad 105 of the package substrate 100. The external connection terminal 110 may include, for example, a solder ball, a conductive bump, a conductive paste, a ball grid array (BGA), a lead grid array (LGA), or a pin grid array (PGA), or a combination thereof. In some embodiments, the external connection terminal 110 may be omitted.

The first and second lower semiconductor chips 210 and 220 may include semiconductor substrates 211 and 221, having an active surface and a non-active surface, located opposite to the active surface, respectively. A plurality of active/passive elements (e.g., transistors) and bonding pads 213 and 223 connected thereto may be formed on the active surfaces of the semiconductor substrates 211 and 221, respectively. The non-active surfaces of the first and second lower semiconductor chips 210 and 220 may be surfaces facing an upper surface of the package substrate 100 (e.g., the non-active surfaces of the first and second lower semiconductor chips 210 and 220 may be surfaces of the semiconductor substrates 211 and 221 that are nearest the package substrate 100). The first and second lower semiconductor chips 210 and 220 may be bonded to the upper surface of the package substrate 100 using adhesive layers 217 and 227, respectively.

The first and second lower semiconductor chips 210 and 220 may be electrically connected to the package substrate 100 by wires 215 and 225, respectively. The wires 215 and 225 may connect the bonding pads 213 and 223 of the first and second lower semiconductor chips 210 and 220 and first pads 103A, among the upper substrate pad 103, respectively.

In a similar manner to the first and second lower semiconductor chips 210 and 220, the upper semiconductor chip 300 may include a semiconductor substrate 311 having an active surface and a non-active surface, located opposite to the active surface. A plurality of active/passive elements (e.g., transistors) and bonding pads 313 connected thereto may be formed on the active surface of the semiconductor substrate 311. The non-active surface of the upper semiconductor chip 300 may be a surface facing the upper surface of the package substrate 100. The upper semiconductor chip 300 may be bonded to upper surfaces of the first and second lower semiconductor chips 210 and 220 using a non-conductive adhesive layer 317. The non-conductive adhesive layer 317 may be formed on the lower surface of the upper semiconductor chip 300, and may be then bonded to the first and second lower semiconductor chips 210 and 220.

In a similar manner to the first and second lower semiconductor chips 210 and 220, the upper semiconductor chip 300 may be electrically connected to the package substrate 100 by a wire 315. The wire 315 may connect the bonding pads 313 of the upper semiconductor chip 300 and second pads 103B, among the upper substrate pad 103, respectively.

The semiconductor package 10 employed in this embodiment may further include a molded member 500 on, and in some embodiments surrounding, the first and second lower semiconductor chips 210 and 220 and the upper semiconductor chip 300. It will be understood that "an element A surrounds an element B" (or similar language) as used herein means that the element A is at least partially around the element B but does not necessarily mean that the element A completely encloses the element B.

The molded member 500 may be on and/or surround the first and second lower semiconductor chips 210 and 220 and the upper semiconductor chip 300 to protect the first and second lower semiconductor chips 210 and 220 and the upper semiconductor chip 300 from an external environment. The molded member 500 may be formed by injecting an appropriate amount of molding resin onto the package substrate 100 in an injection process, and performing a curing process to form an external shape of the semiconductor package 10. In some embodiments, the molding resin may be pressurized to form the external shape of the semiconductor package 10 by a pressurization process such as a press. In this case, process conditions such as delay time between the injection process of the molding resin and the pressurization process of the molding resin, an amount of the molding resin injected, and/or a temperature/pressure of the pressurization process may be set in consideration of physical properties such as viscosity of the molding resin.

The molded member 500 may include an epoxy-based molding resin or a polyimide-based molding resin. For example, the molded member 500 may include an epoxy molding compound (EMC) or a high-K epoxy molding compound.

The upper semiconductor chip 300 may be bonded to the active surfaces of the first and second lower semiconductor chips 210 and 220 by the non-conductive adhesive layer 317. The upper semiconductor chip 300 may be disposed to be on, and in some embodiments cover, the upper surfaces of the first and second lower semiconductor chips 210 and 220. An area of the upper semiconductor chip 300 to be mounted may be greater than an area of the first and second lower semiconductor chips 210 and 220 to be mounted, but is not limited thereto.

In an embodiment, upper portions of the first and second lower semiconductor chips 210 and 220 may be received in the non-conductive adhesive layer 317. In this case, "the upper portions may be received" refers to a state into which not only the upper portions of the first and second lower semiconductor chips 210 and 220, but also portions of side surfaces of the first and second lower semiconductor chips 210 and 220, adjacent to the upper portions, are surrounded by the non-conductive adhesive layer 317.

This feature may also be expressed by a thickness of each portion of the non-conductive adhesive layer 317. In the non-conductive adhesive layer 317, a thickness (T2) (e.g., in a direction perpendicular to an upper surface of the package substrate 100) of a portion of the non-conductive adhesive layer 317 between the first and second lower semiconductor chips 210 and 220 may be greater than a thickness (T1a and/or T1b) (e.g., in a direction perpendicular to the upper surface of the package substrate 100) of a portion of the non-conductive adhesive layer 317 respectively bonded to the first and second lower semiconductor chips 210 and 220.

The first and second lower semiconductor chips 210 and 220 employed in this embodiment may be different types of semiconductor chips having different heights (Ha and Hb). As illustrated in FIG. 2, a level of an upper surface of the first lower semiconductor chip 210 may be higher (e.g., farther from the upper surface of the package substrate 100) than a level of an upper surface of the second lower semiconductor chip 220, and a received depth of the first lower semiconductor chip 210 may be greater than a received depth of the second lower semiconductor chip 220. For example, in some embodiments, the first lower semiconductor chip 210 may extend farther into the non-conductive adhesive layer 317 than the second lower semiconductor chip 220.

When this feature is expressed by the thickness of each portion of the non-conductive adhesive layer 317, the thickness (T1a) of the portion of the non-conductive adhesive layer 317 bonded to the first lower semiconductor chips 210 may be less than the thickness (T1b) of the portion of the non-conductive adhesive layer 317 bonded to the second lower semiconductor chips 220. Therefore, the upper semiconductor chip 300 may be aligned relatively horizontally, despite a relatively large difference in levels between the upper surfaces of the first and second lower semiconductor chips 210 and 220.

The semiconductor package 10 according to some embodiments of the present inventive concepts may solve a problem of mechanical deterioration caused by the non-conductive adhesive layer 317. This effect will be described in detail with reference to FIG. 3.

As described above, the first and second lower semiconductor chips 210 and 220 may be mounted on the package substrate 100 at different heights and/or so as to have different heights (Ha and Hb). As such, when a deviation in heights of the first and second lower semiconductor chips 210 and 220 is high, a conventional non-conductive adhesive layer may not sufficiently receive the first and second lower semiconductor chips 210 and 220 (especially, the second lower semiconductor chip 220 having a relatively low height Hb) due to its relatively high viscosity.

Figure 3:
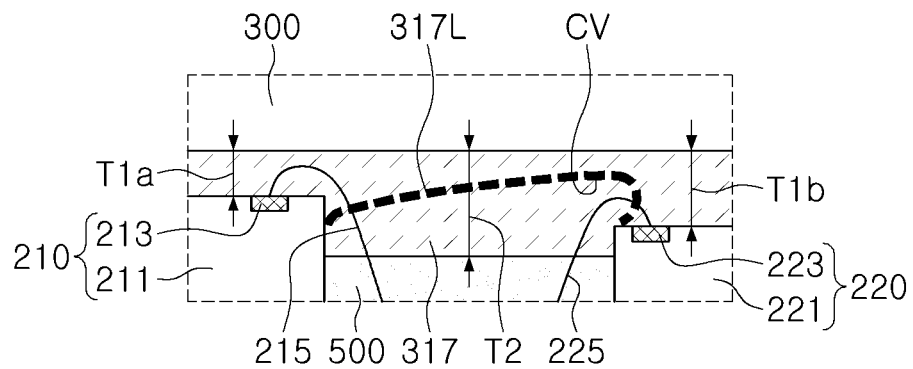
FIG. 3 is an enlarged view of portion "A" of the semiconductor package of FIG. 2.

FIG. 3 is an enlarged view of portion "A" of the semiconductor package of FIG. 2. In FIG. 3, a lower surface of a conventional non-conductive film 317L is illustrated with a dashed line.

Referring to FIG. 3, a conventional non-conductive film 317L (a lower surface thereof is indicated by a dotted line) may be only bonded to the upper surface of the second lower semiconductor chip 220 having a relatively low height, and may not extend to a side portion thereof, adjacent to the upper surfaces. Therefore, it may be difficult to provide a firm bond between the upper semiconductor chip 300 and the second lower semiconductor chip 220.

In particular, the conventional non-conductive film 317L may have a concave portion CV recessed on a corner of the second lower semiconductor chip 220. Since it may be hardly filled up to the concave portion CV when the molded member 500 is applied, even after the molded member 500 is applied, voids may be generated between the upper semiconductor chip 300 and the second lower semiconductor chip 220. Therefore, mechanical reliability of the semiconductor package 10 may be significantly deteriorated.

In the semiconductor package 10 according to some embodiments of the present inventive concepts, as described above, the upper portions of the first and second lower semiconductor chips 210 and 220 may be disposed in the non-conductive adhesive layer 317 located on the lower surface of the upper semiconductor chip 300, to ensure a firm joint between the first and second lower semiconductor chips 210 and 220 (particularly, the second lower semiconductor chip 220 having a relatively low height (Hb)) and the upper semiconductor chip 300, and, in addition, to effectively prevent and/or reduce degradation in reliability of a package due to voids after applying the molded member 500.

The degradation in reliability may occur as a difference in levels between the upper surfaces of the first and second lower semiconductor chips 210 and 220 increases. Therefore, some embodiments of the present inventive concepts may be advantageously applied, when the difference in levels between the upper surfaces of the first and second lower semiconductor chips 210 and 220 is relatively high. For example, embodiments described herein may be advantageously applied when the difference in level between the upper surfaces of the first and second lower semiconductor chips 210 and 220 is at least 10 μm.

The non-conductive adhesive layer 317 employed in this embodiment may be formed by using an adhesive film having a viscosity lower than that of a conventional non-conductive adhesive layer (e.g., 1,800 to 5,000 Pa·s at 120° C.), to receive the upper portions of the first and second lower semiconductor chips 210 and 220. For example, an adhesive film for the non-conductive adhesive layer 317 may have a viscosity of about 1,500 Pa·s or less. In this case, the viscosity refers to a viscosity when the viscosity is changed to have a minimum value thereof, and may be a value measured under a temperature condition of about 120° C. The measurement temperature may have an error range of about ±5° C. relative to 120° C.

The non-conductive adhesive layer 317 may be provided as an adhesive layer for bonding the first and second lower semiconductor chips 210 and 220 and the upper semiconductor chip 300, and may be, for example, a non-conductive film (NCF). In some embodiments, the non-conductive adhesive layer 317 may include an adhesive resin. For example, the adhesive resin may include a bisphenol type epoxy resin, a novolac type epoxy resin, a phenol resin, a urea resin, a melamine resin, an unsaturated polyester resin, a resorcinol resin, and combinations thereof.

A portion of the non-conductive adhesive layer 317 bonded to the first and second lower semiconductor chips 210 and 220, respectively, may provide a space for the wires 215 and 225. In some embodiments, the received depth of the first lower semiconductor chips 210 may range from 10% to 50% of the thickness (T2) of the non-conductive adhesive layer 317 (e.g., between the first and second lower semiconductor chips 210 and 220).

In some embodiments, the first and second lower semiconductor chips 210 and 220 may be volatile memory chips and/or non-volatile memory chips. For example, the volatile memory chip may include a dynamic random access memory (DRAM), a static RAM (SRAM), a thyristor RAM (TRAM), a zero capacitor RAM (ZRAM), or a twin transistor RAM (TTRAM). In addition, the non-volatile memory chip may include, for example, a flash memory, a magnetic RAM (MRAM), a spin-transfer torque MRAM (STT-MRAM), a ferroelectric RAM (FRAM), a phase change RAM (PRAM), a resistive RAM (RRAM), a nanotube RRAM, a polymer RAM, a nano-floating gate memory, a holographic memory, a molecular electronics memory, or an insulator resistance change memory.

In some embodiments, the upper semiconductor chip 300 may be a processor chip. For example, the upper semiconductor chip 300 may include a microprocessor, a graphics processor, a signal processor, a network processor, a chipset, an audio codec, a video codec, an application processor, or a system on chip, but is not limited thereto. For example, the upper semiconductor chip 300 may be or include a microprocessor that includes a single core or multiple cores.

In the above-described embodiment, the semiconductor package 10 is illustrated to include first and second lower semiconductor chips 210 and 220, and the upper semiconductor chip 300 bonded to the upper surfaces of the first and second lower semiconductor chips 210 and 220. In some embodiments, in the semiconductor package 10, at least one semiconductor chip may be replaced with a dummy chip, such as a stiff member or a heat spreader (see, e.g., FIGS. 4, 8, and 12), and the dummy chip may be additionally disposed (see, e.g., FIG. 10). In some embodiments, the at least one semiconductor chip may be a chip stack in which a plurality of semiconductor chips may be stacked (see, e.g., FIG. 7).

In this specification, the term "chip structure" may be used to refer to a chip-shaped structure such as the semiconductor chip, the dummy chip, and the chip stack. For example, it may be referred to as a lower chip structure or an upper chip structure, depending on a position of the chip structure.

Figure 4:
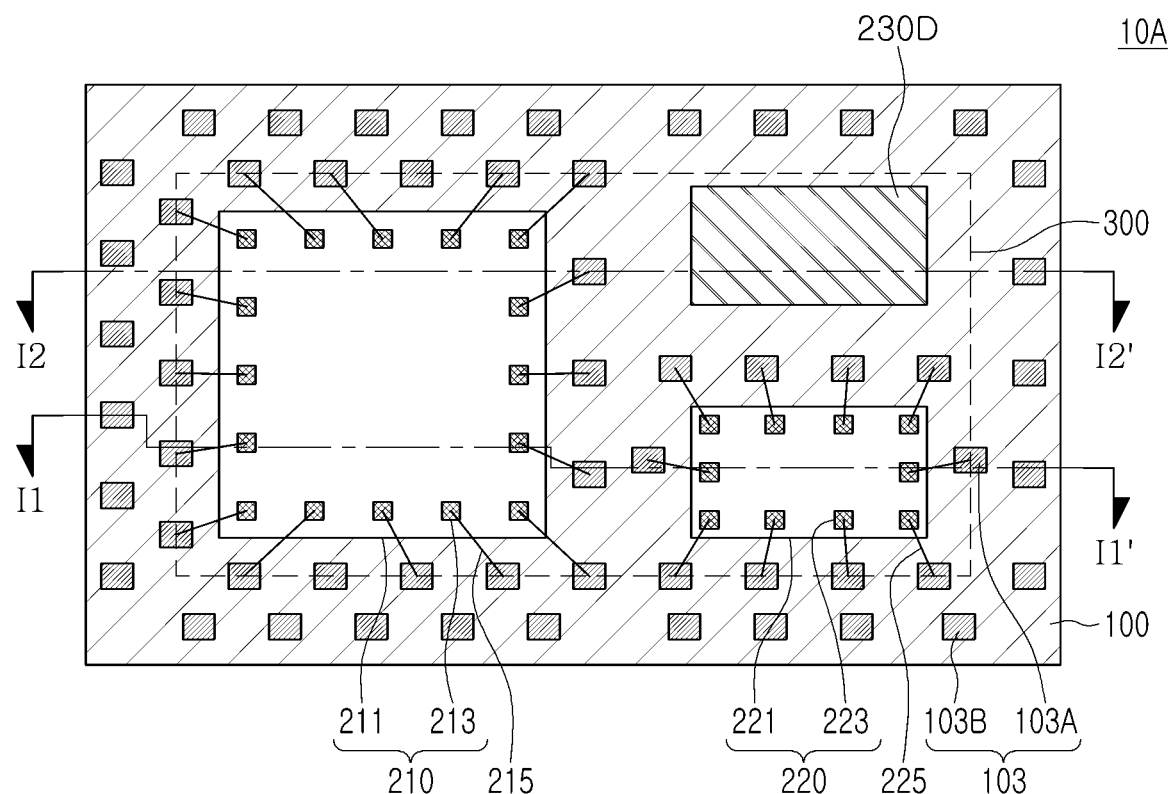
FIG. 4 is a plan view of a semiconductor package according to an embodiment of the present inventive concepts.
Figure 5A:
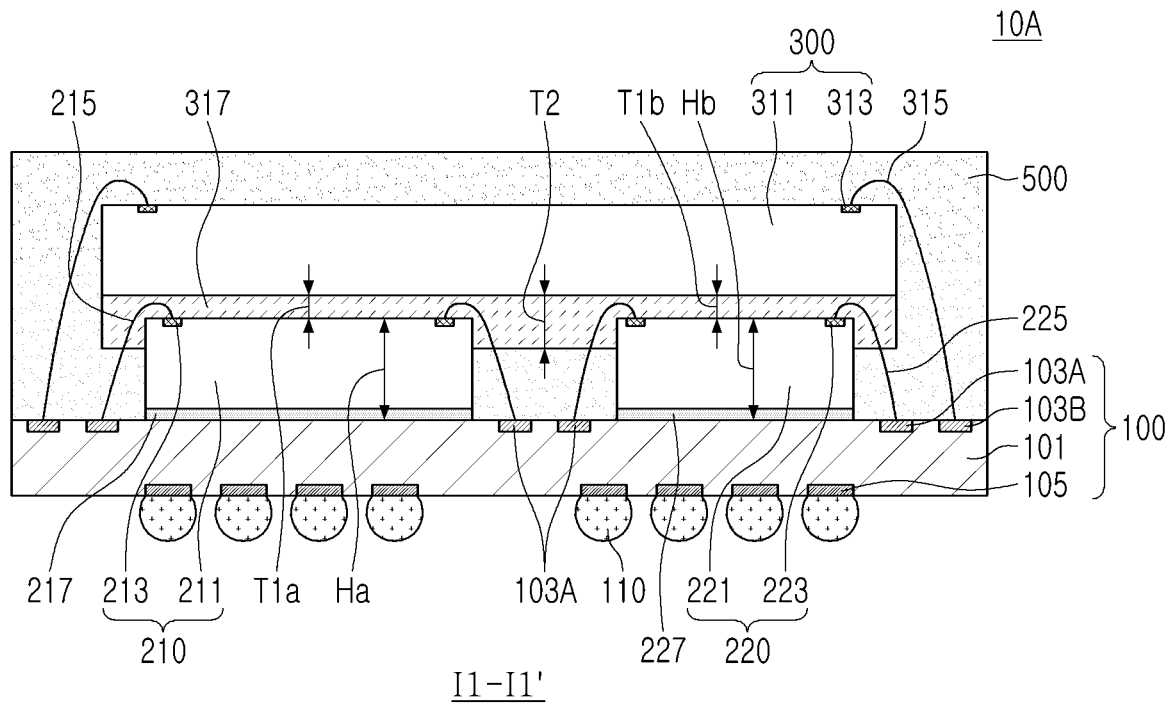
FIGS. 5A and 5B are cross-sectional views taken along lines I1-I1' and I2-I2' of the semiconductor package of FIG. 4, respectively.
Figure 5B:
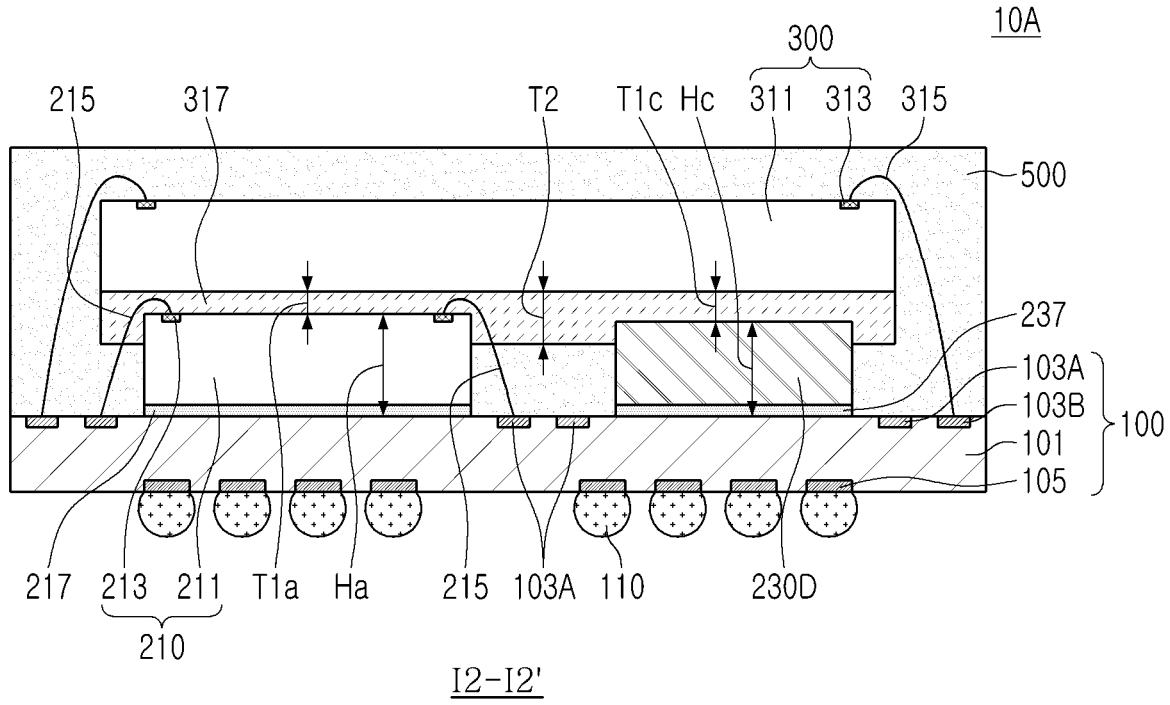

FIG. 4 is a plan view of a semiconductor package 10A according to an embodiment of the present inventive concepts, and FIGS. 5A and 5B are cross-sectional views taken along lines I1-I1' and I2-I2' of the semiconductor package 10A of FIG. 4, respectively.

Referring to FIGS. 4, 5A, and 5B, it may be understood that a semiconductor package 10A according to this embodiment has a similar structure as the embodiment illustrated in FIGS. 1 to 3, except for a further inclusion of a dummy chip 230D as a lower chip structure. Therefore, the description of the embodiment illustrated in FIGS. 1 to 3 may be combined with a description of this embodiment, unless otherwise stated.

The semiconductor package 10A according to this embodiment may include a package substrate 100, first and second lower semiconductor chips 210 and 220 disposed on the package substrate 100, a dummy chip 230D disposed on the package substrate 100, and an upper semiconductor chip 300 disposed on the first and second lower semiconductor chips 210 and 220 and the dummy chip 230D. The dummy chip 230D may be provided as a lower chip structure together with the first and second lower semiconductor chips 210 and 220, to stably support the upper semiconductor chip 300.

Referring to FIGS. 5A and 5B, the upper semiconductor chip 300 may be bonded to active surfaces of the first and second lower semiconductor chips 210 and 220 and an upper surface of the dummy chip 230D by a non-conductive adhesive layer 317. The upper semiconductor chip 300 may be disposed to be on and, in some embodiments, cover upper surfaces of the first and second lower semiconductor chips 210 and 220. An area of the upper semiconductor chip 300 to be mounted may be greater than an area of the first and second lower semiconductor chips 210 and 220 to be mounted and the dummy chip 230D to be mounted.

The first and second lower semiconductor chips 210 and 220 and the dummy chip 230D mounted on the package substrate 100 may have different heights (Ha, Hb, and Hc). An upper portion of the dummy chip 230D, together with upper portions of the first and second lower semiconductor chips 210 and 220, may be received in the non-conductive adhesive layer 317. In view of a thickness of each portion of the non-conductive adhesive layer 317, a thickness (T2) of a portion of the non-conductive adhesive layer 317 between the first and second lower semiconductor chips 210 and 220 may be greater than a thickness (T1$a$, T1$b$, or T1$c$) of a portion of the non-conductive adhesive layer 317 respectively bonded to the first and second lower semiconductor chips 210 and 220 and the dummy chip 230D.

A received depth of the first and second lower semiconductor chip 210 or 220 may be different from a received depth of the dummy chip 230D. Specifically, the received depths may be proportional to mounting heights (Ha, Hb, and Hc), and the thicknesses (e.g., T1$a$<T1$b$<T1$c$) of the non-conductive adhesive layer 317 may be inversely proportional to the mounting heights (e.g., Ha>Hb>Hc).

In some embodiments, the upper semiconductor chip 300 may be aligned relatively horizontally, in spite of the difference in levels between the upper surfaces of the first and second lower semiconductor chips 210 and 220 and the upper surface of the dummy chip 230D.

In addition, in the semiconductor package 10A according to this embodiment, all of the upper portions of the first and second lower semiconductor chips 210 and 220 and the upper portion of the dummy chip 230D may be received in the non-conductive adhesive layer 317 disposed on a lower surface of the upper semiconductor chip 300. Therefore, a firm joint between all of the lower chip structures and the upper semiconductor chip 300 may be provided, and after a molded member 500 is applied, generation of voids may be reduced and/or suppressed.

Figure 6:
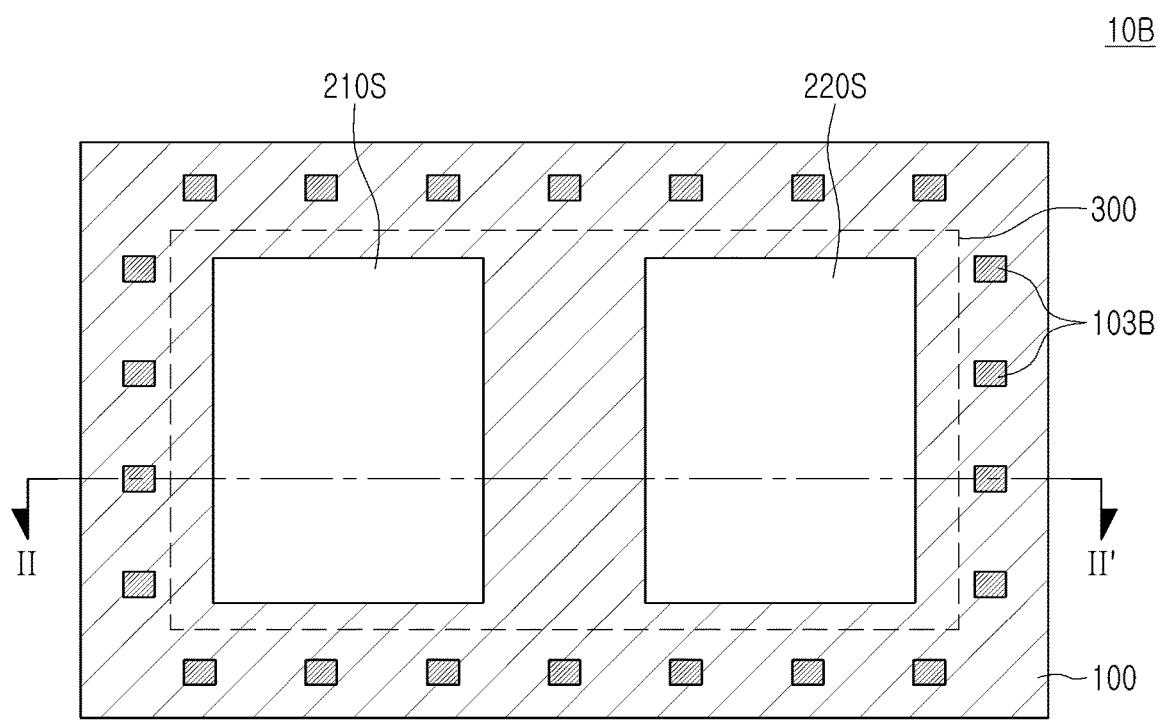
FIG. 6 is a plan view of a semiconductor package according to an embodiment of the present inventive concepts.
Figure 7:
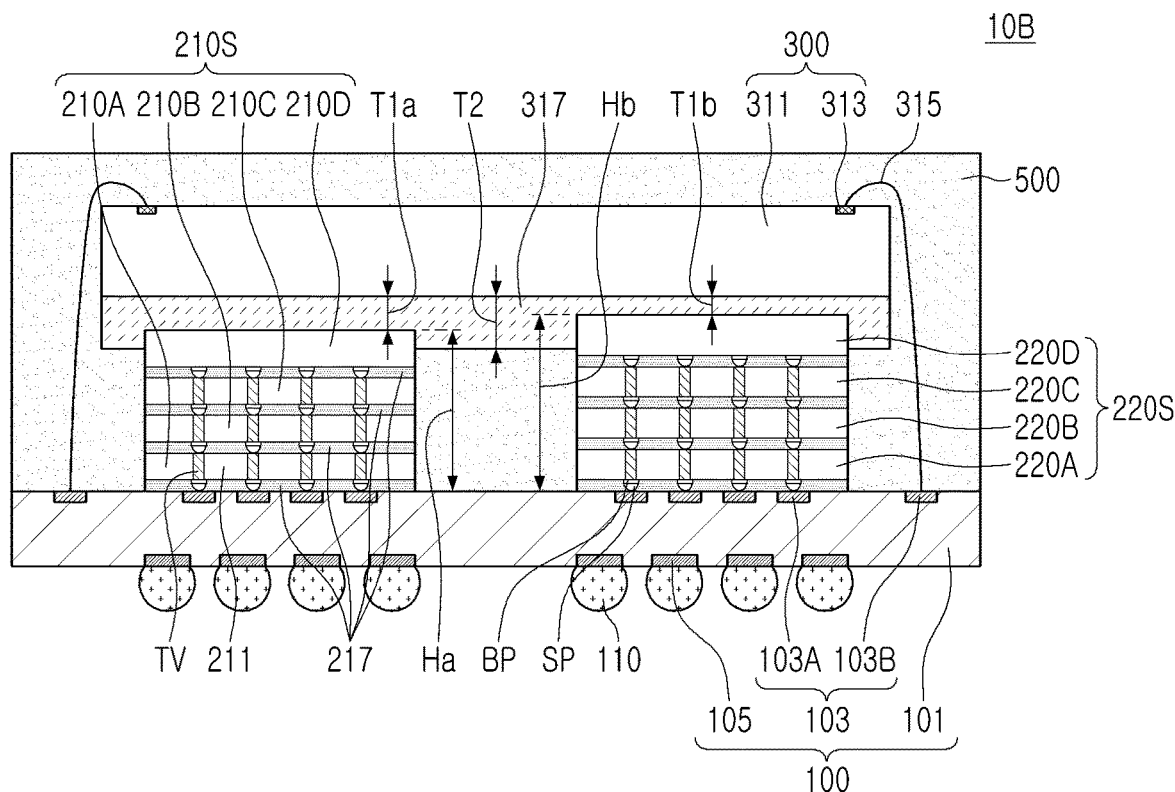
FIG. 7 is a cross-sectional view taken along line II-II' of the semiconductor package of FIG. 6.

FIG. 6 is a plan view of a semiconductor package 10B according to an embodiment of the present inventive concepts, and FIG. 7 is a cross-sectional view taken along line II-II' of the semiconductor package 10B of FIG. 6.

Referring to FIGS. 6 and 7, it may be understood that a semiconductor package 10B according to this embodiment has a similar structure as the embodiment illustrated in FIGS. 1 and 2, except that first and second chip stacks are employed as a lower chip structure. Therefore, the description of the embodiment illustrated in FIGS. 1 to 3 may be combined with a description of this embodiment, unless otherwise stated.

The semiconductor package 10B according to this embodiment may include a package substrate 100, first and second chip stacks 210S and 220S disposed on the package substrate 100, and an upper semiconductor chip 300 disposed on the first and second chip stacks 210S and 220S.

The first and second chip stacks 210S and 220S may include first to fourth semiconductor chips 210A to 210D and 220A to 220D, sequentially stacked, and adhesive films 217 disposed therebetween, respectively. The first to fourth semiconductor chips 210A to 210D and 220A to 220D may be memory chips. The first to fourth semiconductor chips 210A to 210D and 220A to 220D may have substantially the same planar shape and planar area. A thickness of each of the fourth semiconductor chips 210D and 220D may be greater than a thickness of each of the first to third semiconductor chips 210A to 210C and 220A to 220C.

Each of the first to fourth semiconductor chips 210A to 210D and 220A to 220D may include a semiconductor substrate 211 having an active surface facing the package substrate 100 and a non-active surface opposite to the active surface. The active surface of the semiconductor substrate 211 may include active/passive elements (e.g., transistors) and wiring layers connected thereto. The active/passive elements and the wiring layers may constitute a memory circuit.

Each of the first to third semiconductor chips 210A to 210C and 220A to 220C may include through-vias TV passing through the semiconductor substrate 211 and electrically connected to active/passive elements (e.g., the memory circuit). The fourth semiconductor chips 210D and 220D may not include through-vias, but they are not limited thereto.

Each of the first to fourth semiconductor chips 210A to 210D and 220A to 220D may include a bonding pad BP on an active surface of the semiconductor substrate 211. The first semiconductor chips 210A and 220A may be mounted on the package substrate 100 in a face-down state such that the active surfaces thereof face the package substrate 100. The bonding pad BP of the first semiconductor chips 210A and 220A, and first pads 103A, among an upper substrate pad 103, may be connected to each other by an adhesive film 217.

Similarly, the bonding pads BP of the second to fourth semiconductor chips 210B to 210D and 220B to 220D may be passed through and connected to the through-vias TV of the first to third semiconductor chips 210A to 210C and 220A to 220C by the adhesive film 217.

The first and second chip stacks 210S and 220S may have different mounting heights (Ha and Hb) due to, for example, process errors (e.g., a difference in thickness of an adhesive layer 217 and/or a difference in bonding processes), even though same or similar semiconductor chips 210A to 210D and 220A to 220D are stacked in the same number.

As such, even when the first and second chip stacks 210S and 220S may be stacked with the same kind of four semiconductor chips 210A to 210D and 220A to 220D, the first and second chip stacks 210S and 220S may have different mounting heights (Ha and Hb) due to the process error. As discussed herein, a difference in mounting height (e.g., Hb-Ha) may cause generation of voids in comparative devices. For example, the difference in mounting height (e.g., Hb-Ha) may be 10 μm or more.

Referring to FIG. 7, the upper semiconductor chip 300 may be bonded to upper surfaces of the first and second chip stacks 210S and 220S having different heights (Ha and Hb) by a non-conductive adhesive layer 317. The upper semiconductor chip 300 may be disposed to be on and, in some embodiments, cover the upper surfaces of the first and second chip stacks 210S and 220S.

Upper portions of the first and second chip stacks 210S and 220S may be received in the non-conductive adhesive layer 317, similarly to the previously-described embodiments. In view of a thickness of each portion of the non-conductive adhesive layer 317, a thickness (T2) of a portion of the non-conductive adhesive layer 317 between the first and second chip stacks 210S and 220S may be greater than a thicknesses (T1a and/or T1b) of a portion of the non-conductive adhesive layer 317 bonded to each of the first and second chip stacks 210S and 220S (e.g., portions of the non-conductive adhesive layer 317 on an upper surface of the first and second chip stacks 210S and 220S).

In some embodiments, a received depth of each of the first and second chip stacks 210S and 220S may be proportional to a mounting height (Ha and/or Hb) of each of the first and second chip stacks 210S and 220S, and the thickness (e.g., T1a<T1b) of the portion of the non-conductive adhesive layer 317 may be inversely proportional to the mounting height (e.g., Ha>Hb).

In some embodiments, the upper semiconductor chip 300 may be aligned relatively horizontally, despite the difference in level of the upper surfaces of the first and second chip stacks 210S and 220S.

In addition, in the semiconductor package 10B according to some embodiments, both upper portions of the first and second chip stacks 210S and 220S may be received in the non-conductive adhesive layer 317 disposed on a lower surface of the upper semiconductor chip 300. As a firm joint between the first and second chip stacks 210S and 220S and the upper semiconductor chip 300 is provided, the occurrence of voids may be reduced and/or suppressed after the molded member 500 is applied.

Figure 8:
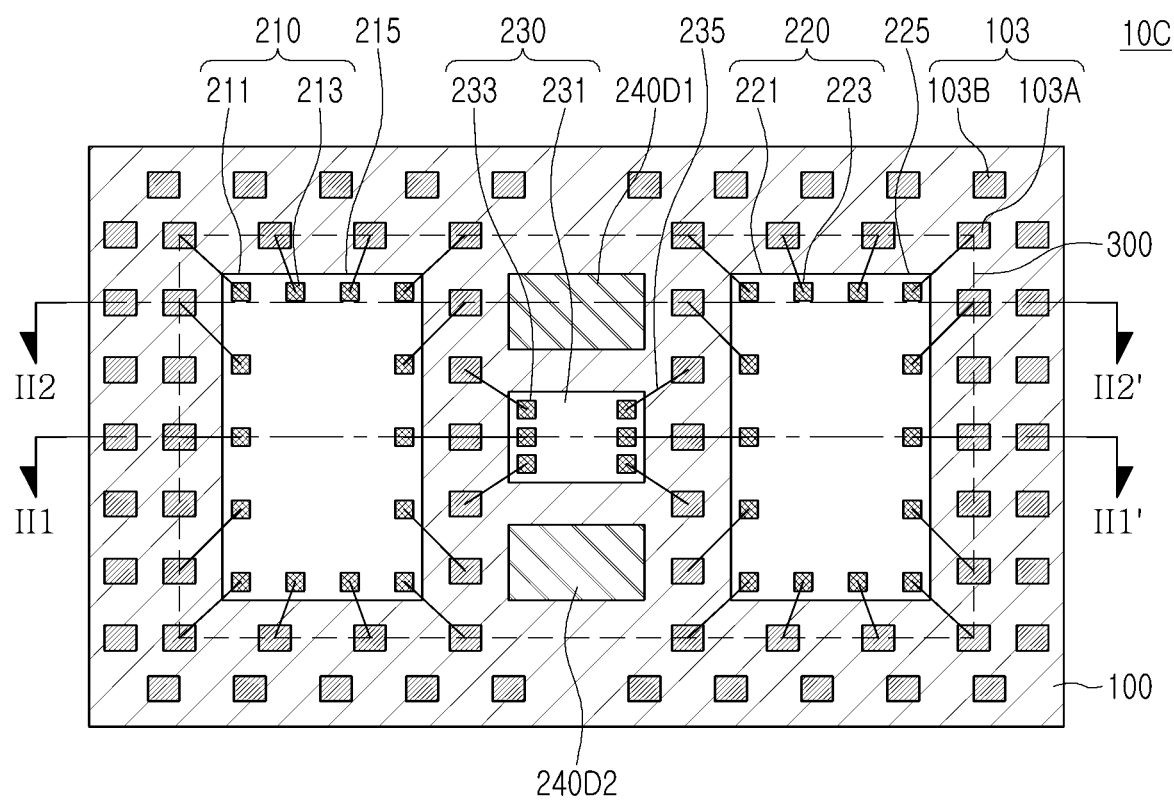
FIG. 8 is a plan view of a semiconductor package according to an embodiment of the present inventive concepts.
Figure 9A:
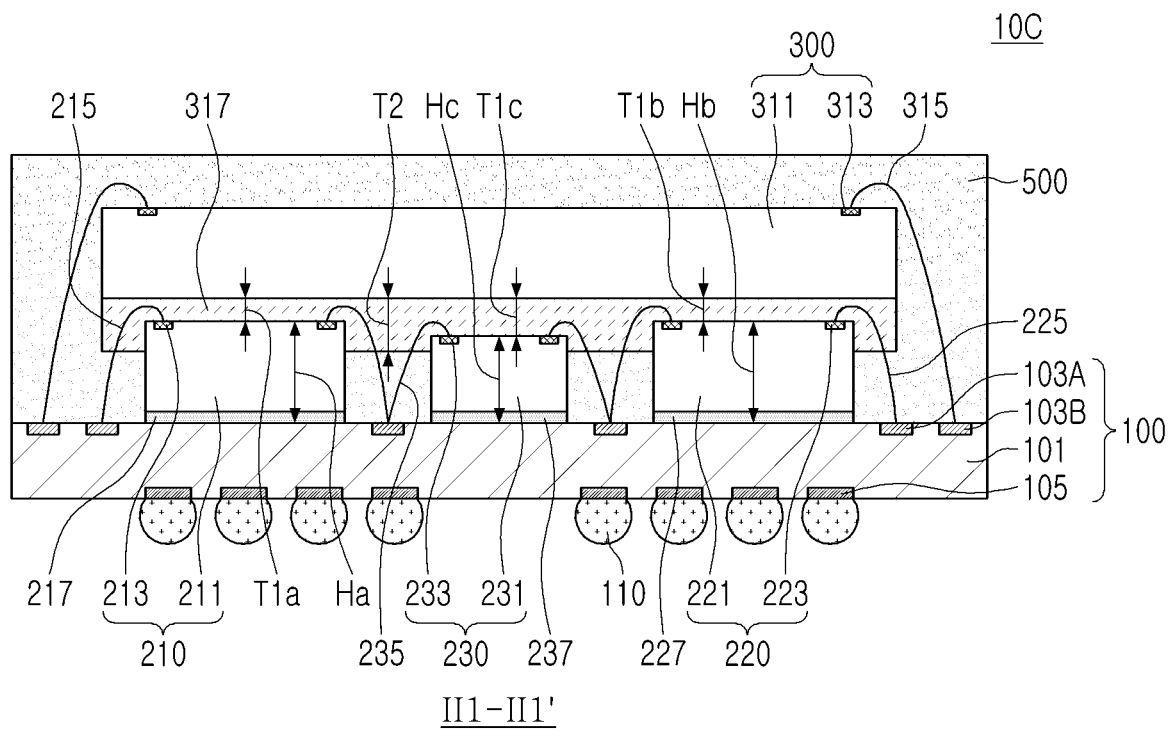
FIGS. 9A and 9B are cross-sectional views taken along lines II1-II1' and II2-II2' of the semiconductor package of FIG. 8, respectively.
Figure 9B:
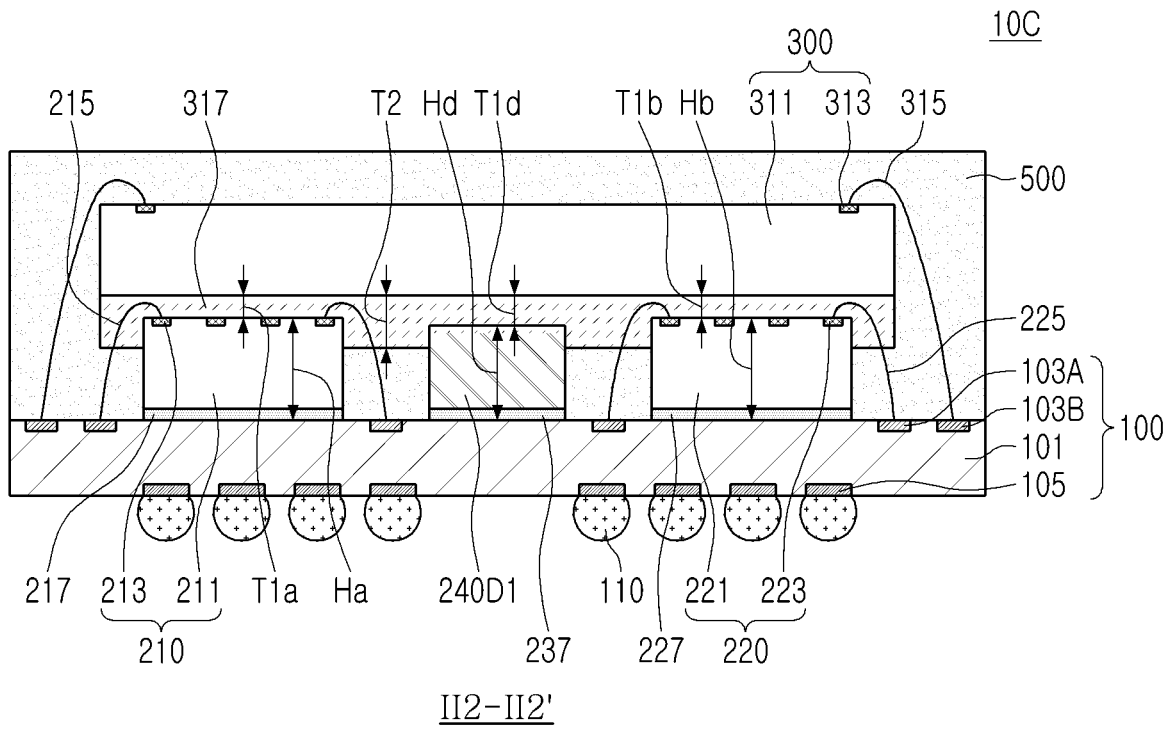

FIG. 8 is a plan view of a semiconductor package 10C according to an embodiment of the present inventive concepts, and FIGS. 9A and 9B are cross-sectional views taken along lines II1-II1' and II2-II2' of the semiconductor package 10C of FIG. 8, respectively.

Referring to FIGS. 8, 9A, and 9B, it may be understood that a semiconductor package 10C according to this embodiment has a similar structure as the embodiment illustrated in FIGS. 1 and 2, except for a more complicated arrangement (three semiconductor chips 210, 220, and 230 and two dummy chips 240D1 and 240D2) as a lower chip structure. Therefore, the description of the embodiment illustrated in FIGS. 1 to 3 may be combined with a description of this embodiment, unless otherwise stated.

The semiconductor package 10C according to some embodiments of the present inventive concepts may include a package substrate 100, first to third lower semiconductor chips 210, 220, and 230 arranged on the package substrate 100, first and second dummy chips 240D1 and 240D2 arranged on the package substrate 100, and an upper semiconductor chip 300 disposed on the first to third lower semiconductor chips 210, 220, and 230, and the first and second dummy chips 240D1 and 240D2. The first and second dummy chips 240D1 and 240D2 may be arranged in a symmetrical structure, together with the first to third lower semiconductor chips 210, 220, and 230 (though the present inventive concepts are not limited thereto), to stably support the upper semiconductor chip 300.

Referring to FIGS. 9A and 9B, the upper semiconductor chip 300 may be bonded to active surfaces of the first to third lower semiconductor chips 210, 220, and 230, and upper surfaces of the first and second dummy chips 240D1, 240D2 by a non-conductive adhesive layer 317. The upper semiconductor chip 300 may be disposed to be on and, in some embodiments, cover upper surfaces of the first to third lower semiconductor chips 210, 220, and 230. An area of the upper semiconductor chip 300 is illustrated to be greater than an area of the first to third lower semiconductor chips 210, 220, and 230 and the first and second dummy chips 240D1 and 240D2. In some embodiments, the upper semiconductor chip 300 may be provided to be on and/or cover only a portion of the first to third lower semiconductor chips 210, 220, and 230, and/or a portion of an area of the first and second dummy chips 240D1 and 240D2 to be mounted.

The third lower semiconductor chip 230 may include semiconductor substrate 231, having an active surface and a non-active surface, located opposite to the active surface. A plurality of active/passive elements (e.g., transistors) and bonding pads 233 connected thereto may be formed on the active surface of the semiconductor substrate 231. The non-active surface of the third lower semiconductor chip 230 may be a surface facing an upper surface of the package substrate 100 (e.g., the non-active surface of the third lower semiconductor chip 230 may be a surface of the semiconductor substrate 231 that is nearest the package substrate 100). The third lower semiconductor chip 230 may be bonded to the upper surface of the package substrate 100 using adhesive layer 237.

The third lower semiconductor chip 230 may be electrically connected to the package substrate 100 by wire 235. The wire 235 may connect the bonding pads 233 of the third lower semiconductor chip 230 and first pads 103A, among the upper substrate pad 103, respectively.

Although the first and second lower semiconductor chips 210 and 220 mounted on the package substrate 100 have similar heights (Ha and Hb), the heights (Ha and Hb) of the first and second lower semiconductor chips 210 and 220 may be different from a height (Hc) of the third lower semiconductor chip 230 and/or a height (Hd) of the first and second dummy chips 240D1 and 240D2, and the height (Hc) of the third lower semiconductor chip 230 may be also different from the height (Hd) of the first and second dummy chips 240D1 and 240D2.

Upper portions of the first to third lower semiconductor chips 210, 220, and 230 and upper portions of the first and second dummy chips 240D1 and 240D2 may be received in the non-conductive adhesive layer 317. In view of a thickness of each portion of the non-conductive adhesive layer 317, a thickness (T2) of a portion of the non-conductive adhesive layer 317 between the first and/or second lower semiconductor chips 210 and 220 and the third lower semiconductor chip 230 may be greater than thickness (T1a, T1b, or T1c) of a portion of the non-conductive adhesive layer 317 respectively bonded to the semiconductor chips 210, 220, and 230, and a thickness (T1d) of a portion of the non-conductive adhesive layer 317 respectively bonded to the first and second dummy chips 240D1 and 240D2 (e.g., bonded to an upper surface of the first and second dummy chips 240D1 and 240D2).

Received depths of the first to third lower semiconductor chips 210, 220, and 230 and the first and second dummy chips 240D1 and 240D2 may be proportional to the mounting heights (e.g., Ha=Hb>Hd>Hc), and the thickness (e.g., Tc>Td>Ta=Tb) of each portion of non-conductive adhesive layer 317 may be inversely proportional to the mounting heights (e.g., Ha=Hb>Hd>Hc).

In the semiconductor package 10C according to this embodiment, the upper portions of the first to third lower semiconductor chips 210, 220, and 230, and the upper portions of the first and second dummy chips 240D1 and 240D2 may be received in the non-conductive adhesive layer 317, located on the lower surface of the upper semiconductor chip 300, to provide a firm joint between all of the lower chip structures and the upper semiconductor chip 300, and to reduce and/or suppress occurrence of voids after the molded member 500 is applied.

Figure 10:
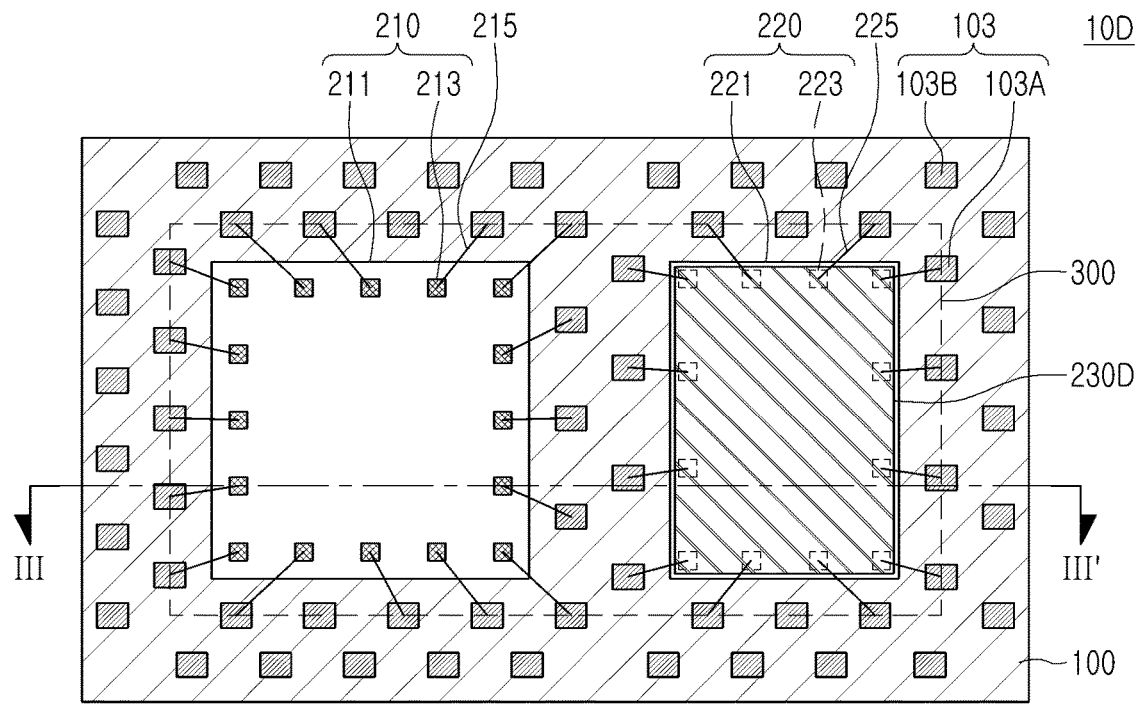
FIG. 10 is a plan view of a semiconductor package according to an embodiment of the present inventive concepts.
Figure 11:
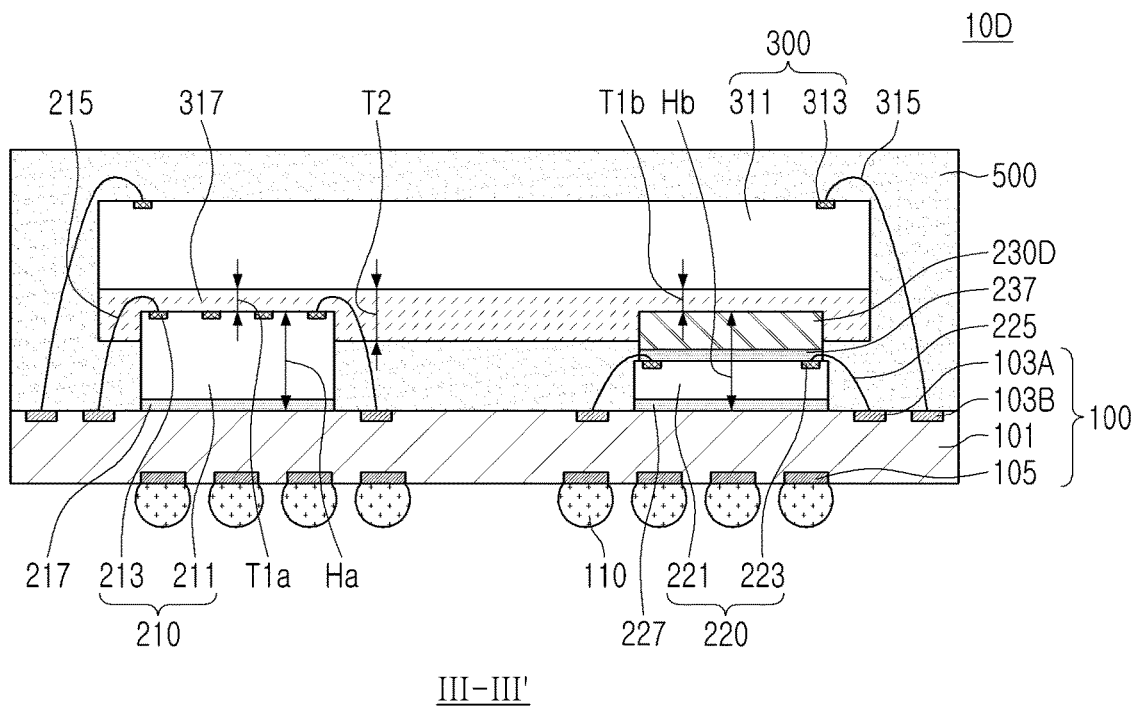
FIG. 11 is a cross-sectional view taken along line III-III' of the semiconductor package of FIG. 10.

FIG. 10 is a plan view of a semiconductor package 10D according to an embodiment of the present inventive concepts, and FIG. 11 is a cross-sectional view taken along line III-III' of the semiconductor package 10D of FIG. 10.

Referring to FIGS. 10 and 11, it may be understood that a semiconductor package 10D according to this embodiment has a similar structure as the embodiment illustrated in FIGS. 1 and 2, except that a single lower chip structure is a stack structure of a semiconductor chip (a second semiconductor chip 220) and a dummy chip 230D. Therefore, the description of the embodiment illustrated in FIGS. 1 to 3 may be combined with a description of this embodiment, unless otherwise stated.

The semiconductor package 10D according to this embodiment may include a package substrate 100, first and second lower semiconductor chips 210 and 220 disposed on the package substrate 100, a dummy chip 230D disposed on the second lower semiconductor chip 220, and an upper semiconductor chip 300 disposed on the first lower semiconductor chips 210 and the dummy chip 230D.

In this embodiment, since a difference in mounting height between the first and second lower semiconductor chips 210 and 220 is remarkably high, the difference may be reduced by disposing the dummy chip 230D on the second lower semiconductor chip 220. The dummy chip 230D may be disposed on an active surface of the second lower semiconductor chip 220 using an adhesive layer 237. As a result, a height (Hb) of a stack structure of the second lower semiconductor chip 220 and the dummy chip 230D may be close to a height (Ha) of the first lower semiconductor chip 210, but there may still be a deviation in height.

Referring to FIG. 11, the upper semiconductor chip 300 may be bonded to an active surface of the first lower semiconductor chips 210 and an upper surface of the dummy chip 230D by a non-conductive adhesive layer 317. The upper semiconductor chip 300 may be disposed to be on and, in some embodiments, cover the active surface of the first lower semiconductor chip 210 and the upper surface of the dummy chip 230D.

Upper portions of the first lower semiconductor chip 210 and the dummy chip 230D may be received in the non-conductive adhesive layer 317. In view of a thickness of each portion of the non-conductive adhesive layer 317, a thickness (T2) of a portion of the non-conductive adhesive layer 317 between the first lower semiconductor chip 210 and the dummy chip 230D may be greater than a thickness (T1a or T1b) of a portion of the non-conductive adhesive layer 317 respectively bonded to the first lower semiconductor chip 210 and the dummy chip 230D (e.g., portions of the non-conductive adhesive layer 317 bonded to upper surfaces of the first lower semiconductor chip 210 and the dummy chip 230D).

Received depths of the first lower semiconductor chips 210 and the dummy chip 230D may be proportional to the mounting heights (Ha and Hb), and the thicknesses (e.g., T1a<T1b) of the non-conductive adhesive layer 317 for each portion may be inversely proportional to the mounting heights (e.g., Ha>Hb).

In the semiconductor package 10D according to this embodiment, all of the upper portions of the first lower semiconductor chips 210 and the dummy chip 230D may be received in the non-conductive adhesive layer 317 disposed on a lower surface of the upper semiconductor chip 300. Therefore, a firm joint between the first lower semiconductor chips 210, the dummy chip 230D, and the upper semiconductor chip 300 may be provided, and after a molded member 500 is applied, generation of voids may be reduced and/or suppressed.

Figure 12:
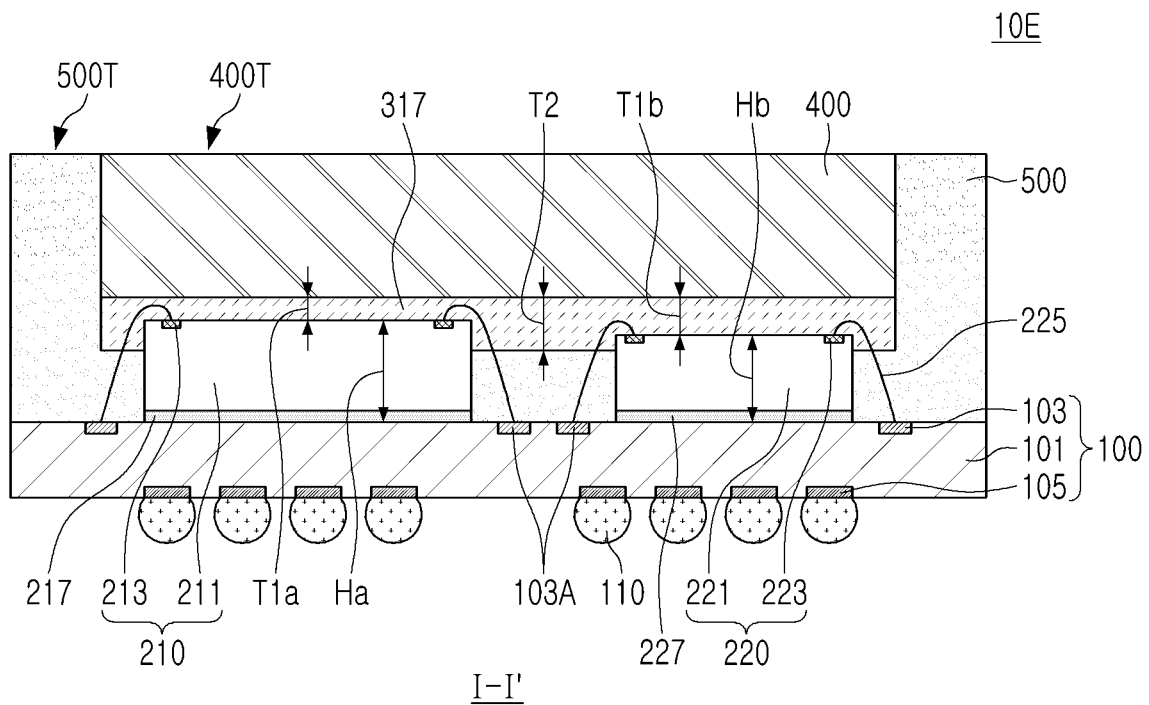
FIG. 12 is a cross-sectional view of a semiconductor package according to an embodiment of the present inventive concepts.

FIG. 12 is a cross-sectional view of a semiconductor package according 10E to an embodiment of the present inventive concepts.

Referring to FIG. 12, it may be understood that a semiconductor package 10E according to this embodiment has a similar structure as the embodiment illustrated in FIGS. 1 and 2, except that a dummy chip 400 as an upper chip structure is further included. Therefore, the description of the embodiment illustrated in FIGS. 1 to 3 may be combined with a description of this embodiment, unless otherwise stated. The cross-section of FIG. 12 is taken along a similar perspective/location as the line I-I' of the semiconductor package 10 of FIG. 1, though the structures of the semiconductor package 10E of FIG. 12 may differ from those of semiconductor package 10 of FIG. 1.

Lower chip structures of the semiconductor package 10E include first and second lower semiconductor chips 210 and 220 disposed side by side on the package substrate 100, similar to the embodiment illustrated in FIG. 2. The dummy chip 400, such as a reinforcing member or a heat dissipation member, may be employed as the upper chip structure. The dummy chip 400 may be disposed on active surfaces (and/or upper surfaces) of the first and second lower semiconductor chips 210 and 220.

In some embodiments, the dummy chip 400 may be a heat dissipation member. An upper surface 400T of the dummy chip 400 may be exposed from an upper surface 500T of a molded member 500. The upper surface 400T of the dummy chip 400 may be coplanar with the upper surface 500T of the molded member 500.

The first and second lower semiconductor chips 210 and 220 mounted on the package substrate 100 may have different heights (Ha and Hb). Upper portions of the first and second lower semiconductor chips 210 and 220 may be received in a non-conductive adhesive layer 317. In view of a thickness of each portion of the non-conductive adhesive layer 317, a thickness (T2) of a portion of the non-conductive adhesive layer 317 between the first and second lower semiconductor chips 210 and 220 may be greater than a thickness (T1a and/or T1b) of the non-conductive adhesive layer 317 respectively bonded to the first and second lower semiconductor chips 210 and 220.

Received depths of the first and second lower semiconductor chips 210 and 220 may be proportional to the mounting heights (Ha and/or Hb), and the thickness (e.g., T1a<T1b) of each portion of the non-conductive adhesive layer 317 may be inversely proportional to the mounting heights (e.g., Ha>Hb).

In some embodiments, the dummy chip 400 may be aligned relatively horizontally, despite a difference in levels of the upper surfaces of the first and second lower semiconductor chips 210 and 220.

In addition, in the semiconductor package 10E according to some embodiments, both the upper portions of the first and second lower semiconductor chips 210 and 220 may be received in the non-conductive adhesive layer 317 disposed on a lower surface of the dummy chip 400. Therefore, a firm joint between the second lower semiconductor chips 210 and 220 and the dummy chip 400 may be provided, and after a molded member 500 is applied, generation of voids may be reduced and/or suppressed.

Figure 13:
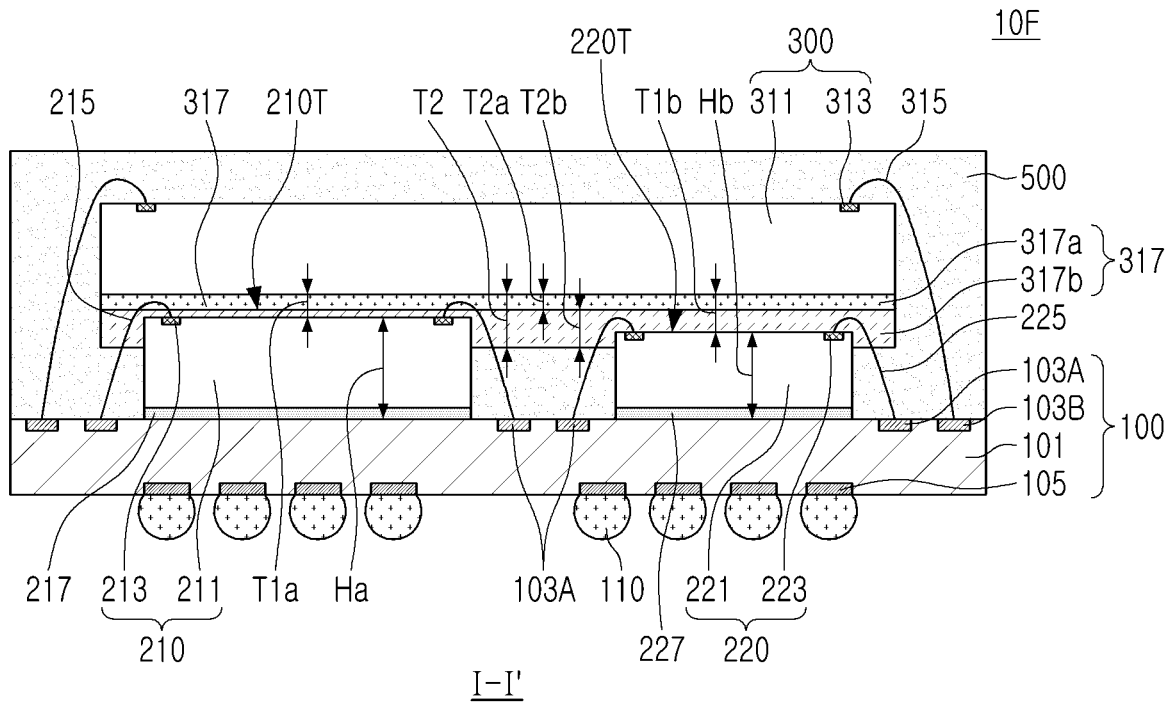
FIG. 13 is a cross-sectional view of a semiconductor package according to an embodiment of the present inventive concepts.

FIG. 13 is a cross-sectional view of a semiconductor package 10F according to an embodiment of the present inventive concepts.

Referring to FIG. 13, it may be understood that a semiconductor package 10F according to this embodiment has a similar structure as the embodiment illustrated in FIGS. 1 and 2, except for a non-conductive adhesive layer 317 including first and second adhesive material layers 317a and 317b sequentially arranged on a lower surface of an upper semiconductor chip 300. Therefore, the description of the embodiment illustrated in FIGS. 1 to 3 may be combined with a description of this embodiment, unless otherwise stated. The cross-section of FIG. 13 is taken along a similar perspective/location as the line I-I' of the semiconductor package 10 of FIG. 1, though the structures of the semiconductor package 10F of FIG. 13 may differ from those of semiconductor package 10 of FIG. 1.

Similar to the embodiment illustrated in FIG. 2, the semiconductor package 10F according to this embodiment may include a package substrate 100, first and second lower semiconductor chips 210 and 220 arranged on the package substrate 100, and an upper semiconductor chip 300 disposed on the first and second lower semiconductor chips 210 and 220.

The upper semiconductor chip 300 may be bonded to active surfaces of the first and second lower semiconductor chips 210 and 220 by a non-conductive adhesive layer 317.

The first and second lower semiconductor chips 210 and 220 mounted on the package substrate 100 may have different heights (Ha and Hb). Upper portions of the first and second lower semiconductor chips 210 and 220 may be received in the non-conductive adhesive layer 317. In view of a thickness of each portion of the non-conductive adhesive layer 317, a thickness (T2) of a portion of the non-conductive adhesive layer 317 between the first and second lower semiconductor chips 210 and 220 may be greater than a thickness (T1a and/or T1b) of a portion of the non-conductive adhesive layer 317 respectively bonded to the first and second lower semiconductor chips 210 and 220.

Received depths of the first and second lower semiconductor chips 210 and 220 may be proportional to mounting heights (Ha and Hb), and the thickness (e.g., T1a<T1b) of each portion of the non-conductive adhesive layer 317 may be inversely proportional to the mounting heights (e.g., Ha>Hb).

The non-conductive adhesive layer 317 employed in this embodiment may include first and second adhesive material layers 317a and 317b sequentially arranged on a lower surface of the upper semiconductor chip 300.

The first adhesive material layer 317a and the second adhesive material layer 317b may be formed of different materials. Before curing, the first adhesive material layer 317a may be configured to have a viscosity smaller than that of the second adhesive material layer 317b. Since the second adhesive material layer 317b has a relatively high viscosity, a space between the first and second lower semiconductor chips 210 and 220 and the upper semiconductor chip 300 may be secured using a thickness (T2b) of the second adhesive material layer 317b. Wires 215 and 225 may be located in the space. In some embodiments, the thickness T1a of a portion of the non-conductive adhesive layer 317 between the first lower semiconductor chip 210 and the upper semiconductor chip 300 may include portions of the first adhesive material layer 317a and/or the second adhesive material layer 317b. In some embodiments, the thickness T1b of a portion of the non-conductive adhesive layer 317 between the second lower semiconductor chip 220 and the upper semiconductor chip 300 may include portions of the first adhesive material layer 317a and/or the second adhesive material layer 317b.

The first adhesive material layer 317a may have the thickness (T2b) sufficient to receive upper portions of the first and second lower semiconductor chips 210 and 220. Upper surfaces of the first and second lower semiconductor chips 210 and 220 may be located on different levels in the first adhesive material layer 317a and/or the second adhesive material layer 317b. In some embodiments, an upper surface 210T of the first lower semiconductor chip 210 may be higher than an upper surface 220T of the second lower semiconductor chip 220, and the upper surface 210T of the first lower semiconductor chip 210 may be located on substantially the same level as an interface of the first and second adhesive material layers 317a and 317b, and/or nearer to the interface than the upper surface 220T of the second lower semiconductor chip 220.

As described above, the first and second lower semiconductor chips 210 and 220 may be received at different depths by using the first adhesive material layer 317a and the second adhesive material layer 317b having different viscosities. A space between the first and second lower semiconductor chips 210 and 220 and the upper semiconductor chip 300 may be stably provided.

Figure 14A:
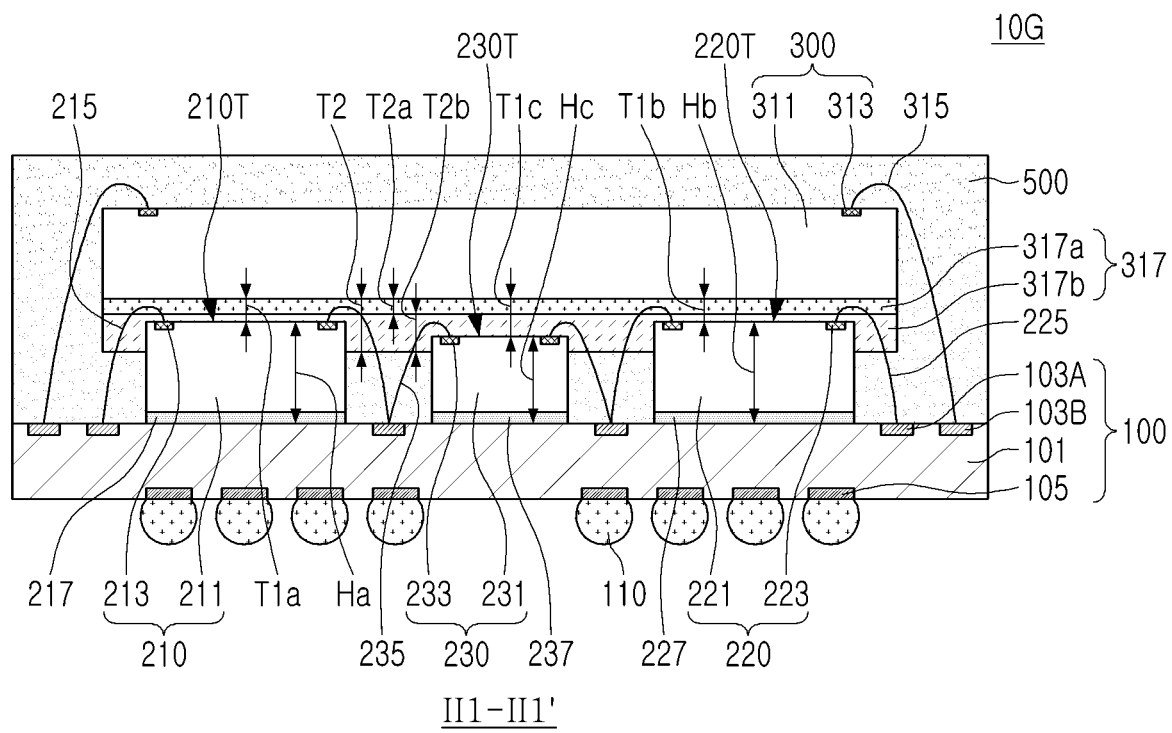
FIGS. 14A and 14B are cross-sectional views of a semiconductor package according to an embodiment of the present inventive concepts.
Figure 14B:
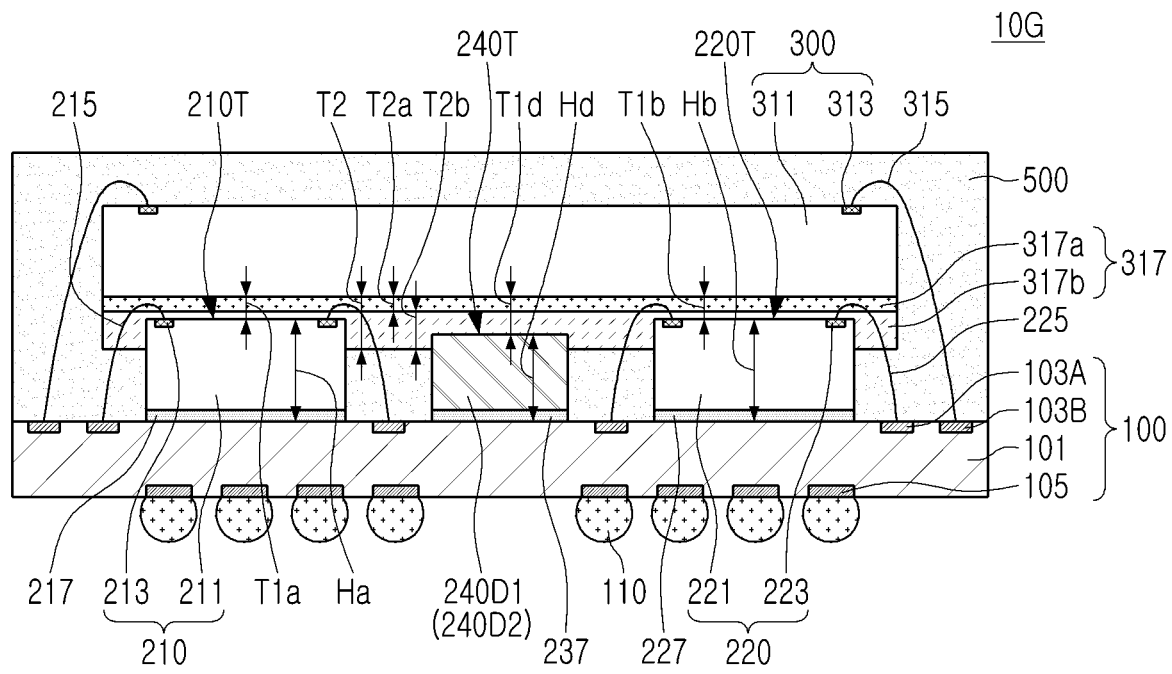

FIGS. 14A and 14B are cross-sectional views of a semiconductor package 10G according to an embodiment of the present inventive concepts.

Referring to FIGS. 14A and 14B, it may be understood that a semiconductor package 10G according to this embodiment has a similar structure as the embodiment illustrated in FIGS. 9A and 9B, except for a non-conductive adhesive layer 317 including first and second adhesive material layers 317a and 317b sequentially arranged on a lower surface of an upper semiconductor chip 300. Therefore, the description of the embodiment illustrated in FIGS. 8 and 9A and 9B may be combined with a description of this embodiment, unless otherwise stated. The cross-sections of FIGS. 14A and 14B are respectively taken along a similar perspective/location as the lines II1-II1' and II2-II2' of the semiconductor package 10C of FIG. 8, though the structures of the semiconductor package 10G of FIGS. 14A and 14B may differ from those of semiconductor package 10C of FIG. 8.

Similar to the embodiment illustrated in FIGS. 8, 9A, and 9B, The semiconductor package 10G according to this embodiment may include a package substrate 100, first to third lower semiconductor chips 210, 220, and 230 arranged on the package substrate 100, first and second dummy chips 240D1 and 240D2 arranged on the package substrate 100, and an upper semiconductor chip 300 arranged on the first to third lower semiconductor chips 210, 220, and 230 and the dummy chips 240D1 and 240D2.

The upper semiconductor chip 300 may be bonded to active surfaces of the first to third lower semiconductor chips 210, 220, and 230 and upper surfaces of the first and second dummy chips 240D1, 240D2 by a non-conductive adhesive layer 317.

The non-conductive adhesive layer 317 employed in this embodiment may include first and second adhesive material layers 317a and 317b sequentially arranged on a lower surface of the upper semiconductor chip 300.

The first adhesive material layer 317a may be configured to have a viscosity lower than that of the second adhesive material layer 317b. A space between the first to third lower semiconductor chips 210, 220, and 230 and the first and second dummy chips 240D1 and 240D2 and the upper semiconductor chip 300 using the second adhesive material layer 317b having a relatively high viscosity may be secured, and wires 215, 225, and 235 may be located in the secured space.

Upper surfaces 210T and 220T of the first and second lower semiconductor chips 210 and 220 and an upper surface 230T of the third lower semiconductor chip 230 may be located on different levels in the first adhesive material layer 317a. In an embodiment, the upper surface 210T of the first lower semiconductor chip 210 may be located higher than the upper surface 220T of the second lower semiconductor chip 220. In some embodiments, upper surfaces 240T of the first and second dummy chips 240D1 and 240D2, and may be located on substantially the same level as an interface between the first and second adhesive material layers 317a and 317b, though the present inventive concepts are not limited thereto.

As such, in a process of receiving the lower chip structures 210, 220, 230, 240D1, and 240D2 at different depths, the first adhesive material layer 317a and the second adhesive material layer 317b having different viscosities may be used to stably ensure a space between the lower chip structures 210, 220, 230, 240D1, and 240D2 and the upper semiconductor chip 300.

In some embodiments, the thickness T1a of a portion of the non-conductive adhesive layer 317 between the first lower semiconductor chip 210 and the upper semiconductor chip 300 may include portions of the first adhesive material layer 317a and/or the second adhesive material layer 317b. In some embodiments, the thickness T1b of a portion of the non-conductive adhesive layer 317 between the second lower semiconductor chip 220 and the upper semiconductor chip 300 may include portions of the first adhesive material layer 317a and/or the second adhesive material layer 317b. In some embodiments, the thickness T1c of a portion of the non-conductive adhesive layer 317 between the third lower semiconductor chip 230 and the upper semiconductor chip 300 may include portions of the first adhesive material layer 317a and/or the second adhesive material layer 317b. In some embodiments, the thickness T1d of a portion of the non-conductive adhesive layer 317 between the first and second dummy chips 240D1 and 240D2 and the upper semiconductor chip 300 may include portions of the first adhesive material layer 317a and/or the second adhesive material layer 317b.

Even when a plurality of lower chip structures are arranged at different heights on the package substrate, a relatively low viscosity non-conductive adhesive layer may be used to stack an upper chip structure, to solve poor adhesion of a portion of the lower chip structures (especially lower chip structures having relatively low heights) due to a difference in height of the lower chip structures, or degradation of reliability due to occurrence of voids (after applying a molded member).

Various and advantages and effects of the present inventive concepts are not limited to the above description. While example embodiments have been illustrated and described above, it will be apparent to those skilled in the art that modifications and variations could be made without departing from the scope of the present inventive concepts as set forth by the appended claims.

What is claimed is:

1. A semiconductor package comprising:
a package substrate;
a plurality of lower chip structures on the package substrate, the plurality of lower chip structures comprising a first chip structure having an upper surface at a first level and a second chip structure having an upper surface at a second level that is lower than that of the first level, wherein an upper surface of at least one of the plurality of lower chip structures is an active surface;
an upper chip structure on the plurality of lower chip structures and covering portions of upper surfaces of the plurality of lower chip structures;
a non-conductive adhesive layer on a lower surface of the upper chip structure and receiving upper portions of the plurality of lower chip structures, including the upper surface of the at least one of the plurality of lower chip structures that is the active surface, wherein the first chip structure extends into the non-conductive adhesive layer by a first depth that is greater than a second depth by which the second chip structure extends into the non-conductive adhesive layer; and
a molded member on the plurality of lower chip structures and the upper chip structure.

2. The semiconductor package according to claim 1, wherein a thickness of a portion of the non-conductive adhesive layer that is located between the first and second chip structures is greater than thicknesses of portions of the non-conductive adhesive layer respectively overlapping the first and second chip structures.

3. The semiconductor package according to claim 1, wherein the first and second chip structures each comprise a chip stack structure in which a plurality of semiconductor chips are stacked.

4. The semiconductor package according to claim 1, wherein the first depth is in a range of 10 to 50% of a thickness of the non-conductive adhesive layer.

5. The semiconductor package according to claim 1, wherein at least one of the plurality of lower chip structures comprises a dummy chip.

6. The semiconductor package according to claim 1, wherein at least one of the plurality of lower chip structures comprises a stack structure having a semiconductor chip and a dummy chip.

7. The semiconductor package according to claim 1, wherein at least one of the plurality of lower chip structures is connected to a circuit of the package substrate by a wire.

8. The semiconductor package according to claim 1, wherein the upper chip structure comprises a dummy chip.

9. The semiconductor package according to claim 1, wherein the non-conductive adhesive layer comprises first and second adhesive material layers sequentially arranged on the lower surface of the upper chip structure.

10. The semiconductor package according to claim 9, wherein the upper surfaces of the plurality of lower chip structures are located at different levels in the first adhesive material layer.

11. A semiconductor package comprising:
a package substrate;
first and second chip structures on the package substrate and having different heights;
a semiconductor chip on the first and second chip structures and covering portions of upper surfaces of the first and second chip structures;
a non-conductive adhesive layer on a lower surface of the semiconductor chip and having first and second receiving portions receiving upper portions of the first and second chip structures, respectively, wherein a thickness of a portion of the non-conductive adhesive layer that is located between the first and second chip structures is greater than respective thicknesses of the first and second receiving portions of the non-conductive adhesive layer; and
a molded member on the package substrate and on the first and second chip structures and the semiconductor chip,
wherein an upper surface of the semiconductor chip is an active upper surface and is connected to the package substrate by wires, and
wherein an upper surface of each of the first and second chip structures is an active upper surface and is connected to the package substrate by wires.

12. The semiconductor package according to claim 11, wherein a first level of an upper surface of the first chip structure is farther from the package substrate than a second level of an upper surface of the second chip structure, and
wherein the thickness of the first receiving portion is smaller than the thickness of the second receiving portion.

13. The semiconductor package according to claim 11, further comprising a dummy chip on the package substrate and having an upper surface bonded to the non-conductive adhesive layer.

14. A semiconductor package comprising:
a package substrate;
a first chip structure on the package substrate and comprising an upper surface at a first distance from the package substrate;
a second chip structure on the package substrate and comprising an upper surface at a second distance from the package substrate, wherein the second distance is different than the first distance;
a semiconductor chip on the upper surfaces of the first and second chip structures; and
a non-conductive adhesive layer comprising a non-conductive adhesive film on a lower surface of the semiconductor chip, wherein the non-conductive adhesive layer comprises a first portion that is between the first chip structure and the semiconductor chip, a second portion that is between the second chip structure and the semiconductor chip, and a third portion that is between the first chip structure and the second chip structure, wherein a thickness of the third portion is greater than a thickness of the first portion and/or the second portion.

15. The semiconductor package according to claim 14, wherein the non-conductive adhesive layer is on side surfaces of the first chip structure and the second chip structure.

16. The semiconductor package according to claim 14, wherein the thickness of the first portion of the non-conductive adhesive layer is different than the thickness of the second portion of the non-conductive adhesive layer.

17. The semiconductor package according to claim 14, further comprising a third chip structure between the first chip structure and the second chip structure,
wherein the third chip structure comprises an upper surface at a third distance from the package substrate, and wherein the third distance is less than the first distance and the second distance.

18. The semiconductor package according to claim 14, wherein the non-conductive adhesive layer comprises a first adhesive material layer having a first viscosity and a second adhesive material layer having a second viscosity that is different from the first viscosity.

* * * * *